(12) United States Patent  
Houston

(10) Patent No.: US 6,687,145 B2
(45) Date of Patent: Feb. 3, 2004

(54) STATIC RANDOM ACCESS MEMORY CELL AND METHOD

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 203 days.

(21) Appl. No.: 10/028,199

(22) Filed: Dec. 20, 2001

(65) Prior Publication Data

US 2002/0085409 A1 Jul. 4, 2002

Related U.S. Application Data

(60) Provisional application No. 60/258,768, filed on Dec. 29, 2000.

(51) Int. Cl.[7] ................................................. G11C 7/00
(52) U.S. Cl. ........................................... 365/51; 365/154
(58) Field of Search ............................ 365/51, 52, 154

(56) References Cited

U.S. PATENT DOCUMENTS 5,903,036 A * 5/1999 Onozawa ..................... 257/390
6,417,032 B1 * 7/2002 Liaw ........................... 438/153

* cited by examiner

Primary Examiner—Vu A. Le
(74) Attorney, Agent, or Firm—Peter K. McLarty; W. James Brady, III; Frederick J. Telecky, Jr.

(57) ABSTRACT

A method for forming a scaled static random access memory (SRAM) cell (10) based on an initial SRAM cell for implementation in a technology scaled from an initial technology. The SRAM cells comprise a plurality of transistors. The method comprises determining a reduction in a minimum gate length (46) for the scaled transistors (14, 16, 18) as compared to a minimum gate length for the initial transistors. The method also comprises forming a scaled drive transistor (16) comprising a gate having a gate length (54) reduced as compared to a gate length for an initial drive transistor. The scaled gate length (54) is reduced by less than the determined reduction in the minimum gate length (46).

12 Claims, 2 Drawing Sheets

STATIC RANDOM ACCESS MEMORY CELL AND METHOD

This application claims priority under 35 USC §119(e)(1) of provisional application Serial No. 60/258,768, filed Dec. 29, 2000.

TECHNICAL FIELD OF THE INVENTION

This invention relates generally to digital memory systems and more particularly to an improved static random access memory cell and method.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices may be transistors, capacitors, resistors and other semiconductor devices. Typically, such devices are fabricated on a substrate and interconnected to form memory arrays, logic structures, timers and other components of an integrated circuit. One type of memory array is a static random access memory (SRAM) in which memory cells are continuously available for reading and writing data. As technology improves, SRAM cells and other components are fabricated at smaller sizes.

For maximum performance in an SRAM cell, drive transistors within the cell are typically designed with a minimum gate length. However, in high performance transistors, threshold voltage varies strongly as a function of gate length. Thus, as gate length is reduced, the transistor's threshold voltage decreases, resulting in a deterioration in noise margin and leakage current for the SRAM cell.

The primary design factor controlling the noise margin of an SRAM cell is the ratio of the strength of the drive transistor to the strength of the pass transistor. The weaker the pass transistor relative to the drive transistor, the greater the noise margin. The greater the variability of the elements of an SRAM cell, the greater the required noise margin. In minimum area SRAM cells, the drive transistor is generally near minimum width.

Thus, to reduce the pass transistor strength relative to the drive transistor strength, the gate length of the pass transistor is made longer than the gate length of the pass transistor. For larger cells, the relative strengths of the driver and pass transistors may be adjusted by having the drive transistor wider than the pass transistor. Even when the drive transistor is made wider than the pass transistor, the pass transistor gate length may be made longer than the driver transistor gate length to reduce leakage to the bit line. The drive transistor gate length is generally made equal to the minimum gate length for the technology, both to improve the ratio of the drive transistor strength to pass transistor strength and to increase read current for a given SRAM cell area.

The read current of an SRAM cell is a primary performance characteristic of an SRAM cell. The read current is limited by both the drive transistor and the pass transistor but the pass transistor has a greater influence. Thus, weakening the pass transistor to improve noise margin decreases the performance of the SRAM cell. Nevertheless, adequate noise margin must be maintained to allow for variability of the SRAM cell components. As technology is scaled, variability tends to increase as a percentage. Thus, as SRAM cells are scaled, the typical procedure is to scale the gate length of the drive transistor as allowed by the technology and to adjust the gate length of the pass transistor to obtain adequate noise margin at minimum area, with some sacrifice of performance.

SUMMARY OF THE INVENTION

In accordance with the present invention, an improved static random access memory (SRAM) cell and method are provided that substantially eliminate or reduce disadvantages and problems associated with previously developed systems and methods. In particular, the present invention provides an SRAM cell with a drive transistor having a gate length corresponding to a threshold voltage that does not vary strongly with gate length, resulting in increased noise margin and reduced leakage current for the SRAM cell without a substantial decrease in performance.

In one embodiment of the present invention, a method is provided for forming a scaled static random access memory (SRAM) cell based on an initial SRAM cell for implementation in a technology scaled from an initial technology. The SRAM cells comprise a plurality of transistors. The method comprises determining a reduction in a minimum gate length for the scaled transistors as compared to a minimum gate length for the initial transistors. The method also comprises forming a scaled drive transistor comprising a gate having a gate length reduced as compared to a gate length for an initial drive transistor. The scaled gate length is reduced by less than the determined reduction in the minimum gate length.

In another embodiment of the present invention, an integrated circuit is provided. The integrated circuit comprises a periphery comprising a plurality of transistors. Each transistor comprises a gate having a specified gate length. The integrated circuit also comprises an SRAM cell comprising a plurality of transistors. The transistors comprise a drive transistor. The drive transistor comprises a gate having a gate length greater than the specified gate length.

In yet another embodiment of the present invention, a method is provided for forming a scaled SRAM cell. The method comprises scaling a pass transistor comprising a gate from a first gate length to a second gate length. The second gate length is a specified percentage of the first gate length. The method also includes scaling a drive transistor comprising a gate from a first gate length to a second gate length. The second gate length is a specified percentage of the first gate length. The specified percentage for the drive transistor is greater than the specified percentage for the pass transistor.

Technical advantages of the present invention include providing an improved SRAM cell. In a particular embodiment, the SRAM cell has a drive transistor with a gate length that is increased beyond the minimum gate length such that the threshold voltage is no longer a strong function of gate length. As a result, the threshold voltage is increased, resulting in the worst case noise margin increasing and leakage current decreasing. However, a pass transistor for the SRAM cell has a gate length that is not increased in proportion to the increase in the drive transistor gate length. Accordingly, the SRAM cell has an improved noise margin and leakage current without a substantial decrease in speed.

Other technical advantages will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings, wherein like numerals represent like parts, in which.

DETAILED DESCRIPTION OF THE INVENTION

Figure 1:
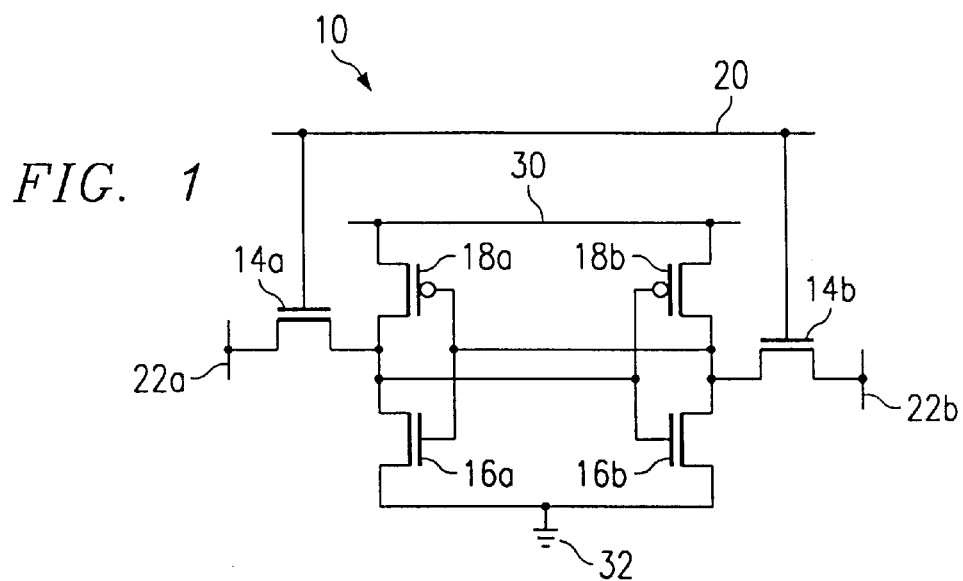
FIG. 1 is a schematic diagram illustrating a static random access memory (SRAM) cell in accordance with one embodiment of the present invention.

FIG. 1 is a schematic diagram illustrating a static random access memory (SRAM) cell 10 in accordance with one embodiment of the present invention. The SRAM cell 10 may be part of a memory array formed on an integrated circuit. In operation, the cell 10 is operable to store data without being externally refreshed as long as power is supplied to the cell 10.

The SRAM cell 10 comprises a plurality of transistors 14, 16 and 18. According to the illustrated embodiment, transistors 14 comprise n-channel, pass transistors, transistors 16 comprise n-channel, drive transistors, and transistors 18 comprise p-channel, load transistors.

The SRAM cell 10 is operable to store a bit of data and is coupled to a word line 20, a bit line 22a and an inverted bit line 22b. These lines 20 and 22 may be used to select the cell 10 for reading the bit of data currently stored in the cell 10 or for writing a bit of data to the cell 10. The value of the bit of data stored in the SRAM cell 10 may be accessed by activating the word line 20 and sensing the voltages on the bit line 22a and the inverted bit line 22b.

As described in more detail below in connection with FIG. 2, the gates for the drive transistors 16 have a slightly greater gate length than a minimum gate length for the transistors 14, 16 and 18. In addition, the threshold voltage corresponding to the gate length for the drive transistors 16 is increased as compared to the threshold voltage corresponding to the minimum gate length, resulting in an improved noise margin and leakage current for the SRAM cell 10.

The load transistors 18 are coupled to a power supply 30, while the drive transistors 16 are coupled to ground 32. According to one embodiment, the power supply 30 comprises a voltage source that is operable to provide a relatively constant voltage to the cell 10. It will be understood, however, that the power supply 30 may comprise any suitable source of power without departing from the scope of the present invention. It will also be understood that the ground 32 comprises any suitable potential that is less than the potential of the power supply 30.

Figure 2:
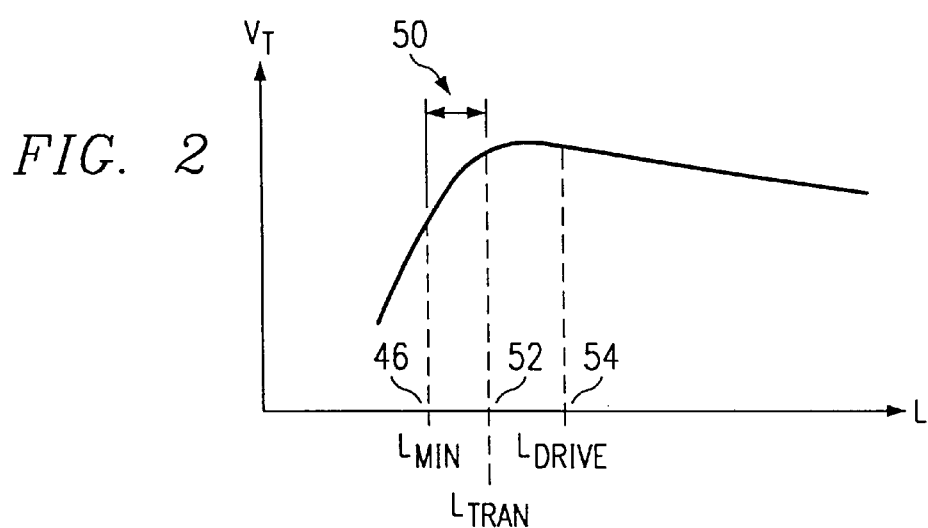
FIG. 2 is a graph of threshold voltage as a function of gate length for the transistors of FIG. 1 in accordance with one embodiment of the present invention.

FIG. 2 is a graph of threshold voltage as a function of gate length for the transistors 14, 16 and 18 of the SRAM cell 10 in accordance with one embodiment of the present invention. The gates of the transistors 14, 16 and 18 have a minimum gate length 46 based on the current technology for fabricating the transistors 14, 16 and 18. Thus, the minimum gate length 46 comprises the shortest possible gate length that may be fabricated utilizing currently available technology. Generally, drive transistors 16 having gates with the minimum gate length 46 result in maximum performance transistors.

The graph of FIG. 2 corresponds to high performance transistors 14, 16 and 18 in which the threshold voltage varies strongly with gate length near the minimum gate length 46. In addition, the threshold voltage for these high performance transistors 14, 16 and 18 is relatively low, which negatively affects noise margin and leakage current.

The graph illustrates an interaction region 50 corresponding to the region of the graph in which the threshold voltage varies strongly as a function of gate length. According to one embodiment, the interaction region 50 comprises the portion of the graph from the minimum gate length 46 to the point where the slope of the graph is less than a pre-determined value.

The graph of FIG. 2 also includes a transition length 52 that corresponds to the point on the graph at which the slope becomes less than the pre-determined value. Thus, lengths greater than the transition length 52 are outside the interaction region 50.

A drive transistor gate length 54 is also illustrated in the graph of FIG. 2. The drive transistor gate length 54 is greater than the transition length 52. Thus, the threshold voltage does not vary strongly with gate length near the drive transistor gate length 54, in contrast to the minimum gate length 46. In addition, the threshold voltage corresponding to the drive transistor gate length 54 is greater than the threshold voltage corresponding to the transition length 52.

Although the minimum gate length 46 and the drive transistor gate length 54 are illustrated as single points on the length axis of the graph, it will be understood that these points 46 and 54 may be representative of a range of length values due to process variation in fabricating the transistors 14, 16 and 18. According to one embodiment, for a minimum gate length 46 of approximately 0.10 m, the drive transistor gate length 54 is approximately 0.11 m.

Figure 3:
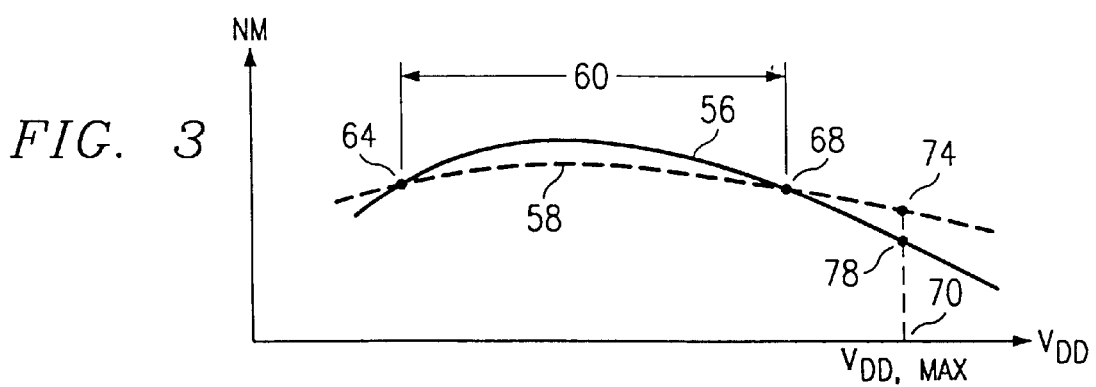
FIG. 3 is a graph of noise margin as a function of supply voltage for the SRAM cell of FIG. 1 in accordance with one embodiment of the present invention.

FIG. 3 is a graph of noise margin as a function of supply voltage for the SRAM cell 10 in accordance with one embodiment of the present invention. The solid line 56 indicates noise margin as a function of supply voltage for a typical SRAM cell comprising a drive transistor with the minimum gate length 46, while the dashed line 58 corresponds to the SRAM cell 10 comprising a drive transistor 16 with the drive transistor gate length 54.

In the region 60 of the graph between the two intersection points 64 and 68 of the lines 56 and 58, the noise margin is slightly higher for a typical SRAM cell. However, at the maximum supply voltage 70, the worst case noise margin 74 for the SRAM cell 10 is higher than the worst case noise margin 78 for the typical SRAM cell. Thus, the SRAM cell 10 has an improved worst case noise margin 74 as compared to a typical SRAM cell.

Figure 4:
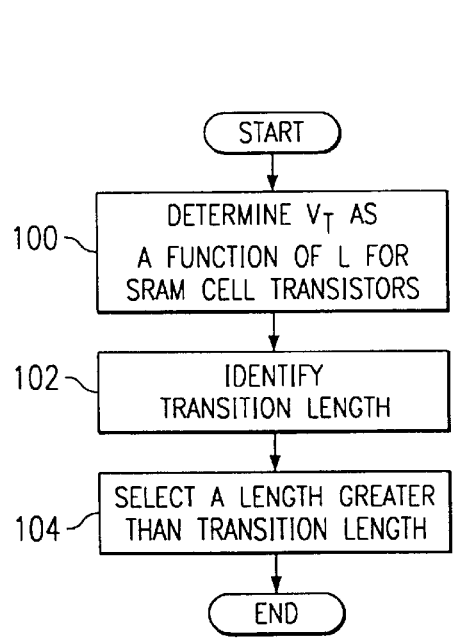
FIG. 4 is a flow diagram illustrating a method for designing the SRAM cell of FIG. 1 in accordance with one embodiment of the present invention.

FIG. 4 is a flow diagram illustrating a method for designing the SRAM cell 10 in accordance with one embodiment of the present invention. The method begins at step 100 where threshold voltage is determined as a function of gate length for the transistors 14, 16 and 18 of the SRAM cell 10. At step 102, the transition length 52 is identified. The transition length 52 corresponds to the last point of the interaction region 50 in which the threshold voltage varies strongly with gate length. Thus, as previously described, the transition length 52 may be identified based on the slope of the graph of threshold voltage as a function of gate length.

At step 104, a drive transistor gate length 54 is selected that is greater than the transition length 52, at which point the method comes to an end. In this way, the SRAM cell 10 has a higher threshold voltage, resulting in an increased worst case noise margin and a decreased leakage current.

Figure 5:
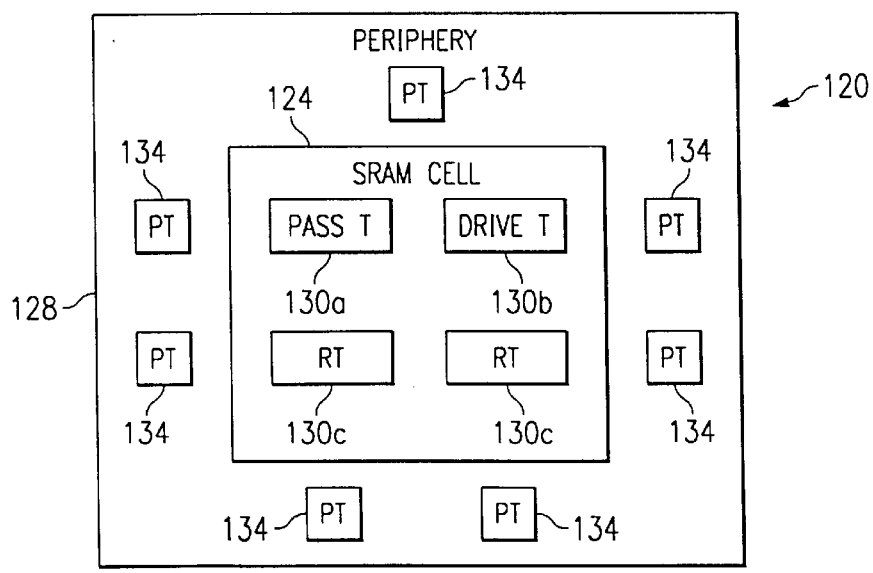
FIG. 5 is a block diagram illustrating an integrated circuit comprising the SRAM cell of FIG. 1 in accordance with one embodiment of the present invention.

FIG. 5 is a block diagram illustrating an integrated circuit 120 comprising at least one SRAM cell 124 constructed in accordance with one embodiment of the present invention. In addition to the SRAM cell 124, the integrated circuit 120 comprises a periphery 128. According to one embodiment, the periphery 128 is operable to provide addressing and other suitable functions for a memory array comprising the SRAM cell 124.

The SRAM cell 124 comprises a plurality of transistors 130. The transistors comprise at least one pass transistor 130a, at least one drive transistor 130b, and a plurality of remaining transistors 130c. The periphery comprises a plurality of peripheral circuits, some or all of which comprise periphery transistors 134.

In accordance with the present invention, the periphery transistors 134 each comprise a gate having the minimum gate length 46 for the corresponding technology associated with the integrated circuit 120. As used herein, "each" means every one of at least a subset of the identified items. In contrast, the drive transistor 130b comprises a gate having the drive transistor gate length 54, as described in more detail above in connection with FIG. 2. The pass transistor 130a and the remaining transistors 130c may each comprise a gate with any suitable gate length.

Figure 6:
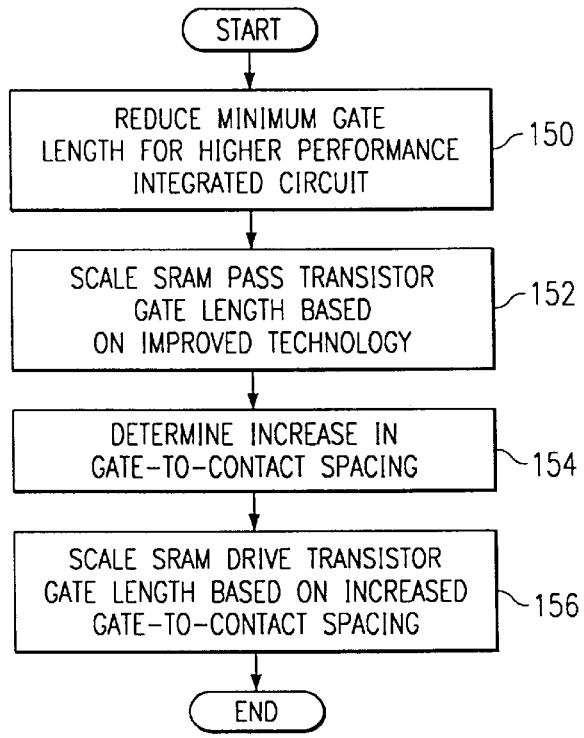
FIG. 6 is a flow diagram illustrating a method for designing the integrated circuit of FIG. 5 in accordance with one embodiment of the present invention.

FIG. 6 is a flow diagram illustrating a method for designing the integrated circuit 120 in accordance with one embodiment of the present invention. The method begins at step 150 where the minimum gate length 46 for the transistors 130 and 134 of the integrated circuit 120 is reduced based on improved technology for a higher performance integrated circuit 120. The reduced minimum gate length 46 for the integrated circuit 120 is, therefore, reduced with respect to a minimum gate length for a previous, lower performance integrated circuit.

At step 152, the length of the gate for the pass transistor 130a of the SRAM cell 124 is scaled based on the improved technology for the higher performance integrated circuit 120. Thus, the pass transistor gate length is reduced in proportion to the reduction in the minimum gate length 46.

At step 154, the increase in the gate-to-contact spacing for the transistors 130 and 134 is determined. This increase in the gate-to-contact spacing is a result of the reduced minimum gate length 46 which allows the gates of the transistors 130 and 134 to be shortened, leaving additional space between the gates and contacts.

At step 156, a drive transistor gate length 54 for the drive transistor 130b of the SRAM cell 124 is scaled based on the increase in the gate-to-contact spacing. According to one embodiment, the drive transistor gate length 54 is selected such that the length 54 is greater than the reduced minimum gate length 46 and the scaled gate length of the pass transistor 130a. According to one embodiment, the drive transistor gate length 54 is not scaled with respect to the previous SRAM cell. However, the resulting drive transistor gate length 54 is limited by the increase in the gate-to-contact spacing. In this way, the size of the resulting SRAM cell 124 in the integrated circuit 120 is not increased as compared to an SRAM cell in the previous, lower performance technology.

According to another embodiment, the drive transistor gate length 54 is selected in step 156 in accordance with the method of FIG. 4, as well as based on the increase in the gate-to-contact spacing. Thus, the drive transistor gate length 54 is scaled such that the increase in the length 54 as compared to a drive transistor gate length in a lower performance integrated circuit is not more than the increase in the gate-to-contact spacing and such that the length 54 is greater than the transition length 52.

In the resulting SRAM cell 124, the pass transistor 130a comprises a gate having the scaled gate length, the drive transistor 130b comprises a gate having the selected drive transistor gate length 54, and the remaining transistors 130c each comprise a gate having a gate length that is substantially unchanged from the gate length for remaining transistors in a lower performance integrated circuit. In the periphery 128, the periphery transistors 134 each comprise a gate having the minimum gate length 46. In this way, the integrated circuit 120 has an increased worst case noise margin 74 and a decreased leakage current.

Although the present invention has been described with several embodiments, various changes and modifications may be suggested to one skilled in the art. It is intended that the present invention encompass such changes and modifications as fall within the scope of the appended claims.

What is claimed is:

1. A method for forming a scaled static random access memory (SRAM) cell based on an initial SRAM cell for implementation in a technology scaled from an initial technology, the SRAM cells comprising a plurality of transistors, the method comprising:

determining a reduction in a minimum gate length for the scaled transistors as compared to a minimum gate length for the initial transistors; and forming a scaled drive transistor comprising a gate having a gate length reduced as compared to a gate length for an initial drive transistor, the scaled gate length reduced by less than the determined reduction in the minimum gate length.

2. The method of claim 1, further comprising forming a scaled pass transistor comprising a gate having a gate length less than a gate length for an initial pass transistor, the gate length for the scaled drive transistor substantially the same as the gate length for the initial drive transistor.

3. The method of claim 2, wherein a ratio of the gate length for the scaled pass transistor to a gate length for the initial pass transistor is less than a ratio of the gate length for the scaled drive transistor to a gate length for the initial drive transistor.

4. The method of claim 2, the gate length for the scaled pass transistor reduced as compared to the gate length for the initial pass transistor, the scaled gate length reduced by the determined reduction in the minimum gate length.

5. The method of claim 1, further comprising determining a transition length associated with the scaled transistors, the gate length for the scaled drive transistor greater than the transition length.

6. The method of claim 5, determining a transition length associated with the scaled transistors comprising determining a point on a graph of threshold voltages for the scaled transistors as a function of gate lengths for the scaled transistors, the point comprising the point at which a slope for the graph becomes less than a pre-determined value.

7. The method of claim 1, further comprising determining an increase in gate-to-contact spacing for the scaled technology as compared to the initial technology, the gate length for the scaled drive transistor based on the increase in gate-to-contact spacing.

8. A method for forming a scaled SRAM cell, the method comprising:

scaling a pass transistor comprising a gate from a first gate length to a second gate length, the second gate length a specified percentage of the first gate length; and scaling a drive transistor comprising a gate from a first gate length to a second gate length, the second gate length a specified percentage of the first gate length, the specified percentage for the drive transistor greater than the specified percentage for the pass transistor.

9. The method of claim 8, the specified percentage for the drive transistor approximately 100%.

10. The method of claim 8, further comprising determining a transition length associated with the scaled transistors, the second gate length for the drive transistor greater than the transition length.

11. The method of claim 10, determining a transition length associated with the scaled transistors comprising determining a point on a graph of threshold voltages for the transistors as a function of gate lengths for the transistors, the point comprising the point at which a slope for the graph becomes less than a pre-determined value.

12. The method of claim 8, further comprising determining an increase in gate-to-contact spacing for the scaled transistors, the second gate length for the drive transistor resulting in a gate-to-contact spacing for the drive transistor that is less than the determined increase in gate-to-contact spacing.

* * * * *